United States Patent [19]
Lee et al.

[11] Patent Number: 5,248,941
[45] Date of Patent: Sep. 28, 1993

[54] SUPERCONDUCTING MAGNETIC FIELD SENSING APPARATUS HAVING DIGITAL OUTPUT, ON-CHIP QUANTUM FLUX PACKET FEEDBACK AND HIGH BIAS MARGINS

[75] Inventors: Gregory S. Lee, Palo Alto; Herbert L. Ko, Mountain View, both of Calif.

[73] Assignee: Hewlett-Packard Company, Palo Alto, Calif.

[21] Appl. No.: 686,714

[22] Filed: Apr. 17, 1991

[51] Int. Cl.[5] .......................................... G01R 33/035
[52] U.S. Cl. ..................... 324/248; 307/306; 505/846
[58] Field of Search ............. 324/244, 248; 307/306; 505/842–846

[56] References Cited

U.S. PATENT DOCUMENTS

| | | | |
|---|---|---|---|
| 4,623,804 | 11/1986 | Goto | 307/476 |
| 4,785,426 | 11/1988 | Harada et al. | 365/162 |
| 4,866,373 | 9/1989 | Harada et al. | 324/127 |
| 4,916,335 | 4/1990 | Goto et al. | 307/306 |
| 5,045,788 | 9/1991 | Hayashi et al. | 324/248 |

OTHER PUBLICATIONS

Fujimaki, et al., "A Single-Chip SQUID Magnetometer", *IEEE Trans.*, ED-35, pp. 2412–2418, No month, 1988.

Primary Examiner—Gerard R. Strecker
Assistant Examiner—Warren S. Edmonds

[57] ABSTRACT

A magnetometer having high sensitivity and high resolution is achieved using superconductive circuit elements. The magnetometer includes a pick-up coil, amplifying transformer quantum flux parametron (QFP), latch, feedback gate and feedback inductor fabricated with superconducting elements and coupled to a bidirectional counter. The magnetometer implements an on-chip negative feedback loop. The pick-up coil senses an external magnetic field or gradient resulting in an induced current which is amplified and fed to the QFP which generates a directional indicator signal sent to the latch. When the polarity of the indicator is indicated as corresponding to the polarity of a latch clock signal, a current signal is sent to the feedback gate causing a packet of quantum flux to be generated. The packet is fed back through the feedback inductor, inducing a current in the pick-up coil which opposes the induced current attributable to the external magnetic field. When the induced current in the pick-up coil attributable to the external magnetic field is offset by the induced current attributable to the feedback flux, the magnetometer stabilizes.

26 Claims, 4 Drawing Sheets

SUPERCONDUCTING MAGNETIC FIELD SENSING APPARATUS HAVING DIGITAL OUTPUT, ON-CHIP QUANTUM FLUX PACKET FEEDBACK AND HIGH BIAS MARGINS

BACKGROUND OF THE INVENTION

This invention relates to a superconducting magnetic field sensing apparatus, and more particularly, to a superconducting magnetometer or gradiometer apparatus having high bias margins and operable over a range of frequencies, including but not limited to frequencies greater than about 1 GHz.

A magnetometer is a device for measuring the intensity of a magnetic field in a particular direction. A gradiometer is a device for measuring the gradient of a magnetic field. In many applications, such as neuromagnetic imaging, highly-sensitive magnetic field readings are needed. One approach for achieving such high sensitivity is to use superconductive circuit elements.

Superconducting circuit elements such as superconducting quantum interference devices (SQUIDs) have been used for magnetometry purposes. Systems using such elements configured in analog fashion typically require external feedback circuitry which is usually bulky and expensive. Such feedback circuitry typically suffers from undesirably-limited slew rates.

The use of a SQUID for magnetometry purposes having on-chip feedback also is known. To provide high sensitivity, however, an impractically-high stability for the clock bias amplitude has been required in the past. Further, because the clock signal input to each respective SQUID would require individual fine tuning, it is impractical to couple a large array of such SQUIDs together for multi-channel magnetometry purposes, such as magnetic imaging. Accordingly, a more capable superconducting magnetic field sensing apparatus is needed.

SUMMARY OF THE INVENTION

According to the invention, a superconducting magnetic field sensing apparatus having high sensitivity, high resolution and high bias margins is provided by use of a magnetic pick-up coil, an amplifying transformer, a quantum flux parametron (QFP) comparator, a pulse-triggered latch and a feedback gate wherein each component is fabricated using superconducting technology. In addition, the apparatus includes an external non-superconducting counting device.

According to one aspect of the invention, the superconducting pick-up coil provides high sensitivity. Current is induced in the pick-up coil, then fed into an amplifying transformer having high gain. An inherently-sensitive quantum flux parametron (QFP) receives the amplified current.

According to another aspect of the invention, high resolution is achieved as a result of high sensitivity, a high slew rate and fine feedback control. The QFP may be clocked at frequencies beyond 1 GHz, resulting in high-speed triggering of a feedback gate. The feedback gate is a superconducting component comprising Josephson junction devices and inductors, which produces a packet of flux in quantum flux units. Such packet is fed back as negative feedback to generate a current in opposition to the induced current of the pick-up coil.

According to another aspect of the invention, the QFP is responsive to transitions of a control clock signal, rather than to a precise clock signal amplitude. Once the control clock signal passes beyond a current amplitude threshold, the QFP is triggered. Amplitudes may exceed the threshold by as much as 50% without negatively impacting the QFP performance. Accordingly, the magnetic field sensing apparatus withstands high current bias margins.

According to another aspect of the invention, the apparatus includes on-chip feedback. In response to a control clock signal transition, the QFP generates an indicator signal which is sent to a superconducting latch. The latch stores such indicator signal value during a latch clock cycle. When an indicator signal of a first polarity occurs during a latch clock cycle portion of the same polarity, then a current signal is output to the feedback gate. The feedback gate, in response generates a packet of quantum flux which is fedback to the pick-up coil (or other component according to the embodiment). Such feedback results in current induction opposing the induced current attributable to the sensed magnetic field.

According to another aspect of the invention, negative feedback is used for insuring convergence of the magnetic field reading. For feedback which is coupled back to the pick-up coil, the induced current at the pick-up coil stabilizes when the current portion attributable to the feedback flux cancels the current portion attributable to the sensed magnetic field. The count at the time of such stabilization corresponds to either one of a magnetic field intensity and direction of the sensed magnetic field (e.g., magnetometer embodiment) or a magnetic field gradient of the sensed magnetic field (e.g., gradiometer embodiment).

According to another aspect of the invention, the latch clock signal is bipolar and the indicator signal is directional. A positive output current is sent to the feedback gate in response to a positive indicator signal occurring during a positive portion of the latch clock signal. A negative output current is sent to the feedback gate in response to a negative indicator signal occurring during a negative portion of the latch clock signal. The latch remains superconducting when a positive indicator signal occurs during a negative portion of the latch clock signal, or when a negative indicator signal occurs during a positive portion of the latch clock signal. Thus, the latch stores a signal of a positive polarity or a negative polarity, or remains superconducting.

The signal stored by the latch is output to an external bidirectional counting device. For a positive signal, the counter counts in a first direction. For a negative polarity, the counter counts in the opposite direction. When the latch remains superconductive, the counter does not change.

According to another aspect of the invention, the clock signals for the latch and the clock signal for the QFP comparator are derived from a common waveform. According to one embodiment, the control clock signal is derived from the latch clock signal. The latch clock signal is a bipolar signal having one-half the frequency of the control clock signal. The control clock signal is unipolar. To achieve the control clock signal, the latch clock signal is input to a full-wave rectifier which forms a unipolar signal of double the frequency.

According to various embodiments, adverse injection coupling of the latch clock signal back into the QFP is substantially eliminated. According to one embodiment, a regulator junction is included at the latch clock input for regulating the latch clock signal so as to substantially eliminate injection coupling. According to another embodiment, the QFP indicator signal is generated during the minima or maxima of the latch clock signal so as to avoid adverse injection coupling. According to another embodiment, the indicator signal from the QFP is a dc current and the latch clock signal lags the control clock signal so as to avoid adverse injection coupling. Accordingly, a reliable QFP indicator signal is output to the latch.

The invention will be better understood by reference to the following detailed description taken in conjunction with the accompanying drawings..

DESCRIPTION OF SPECIFIC EMBODIMENTS

Overview

Figure 1:
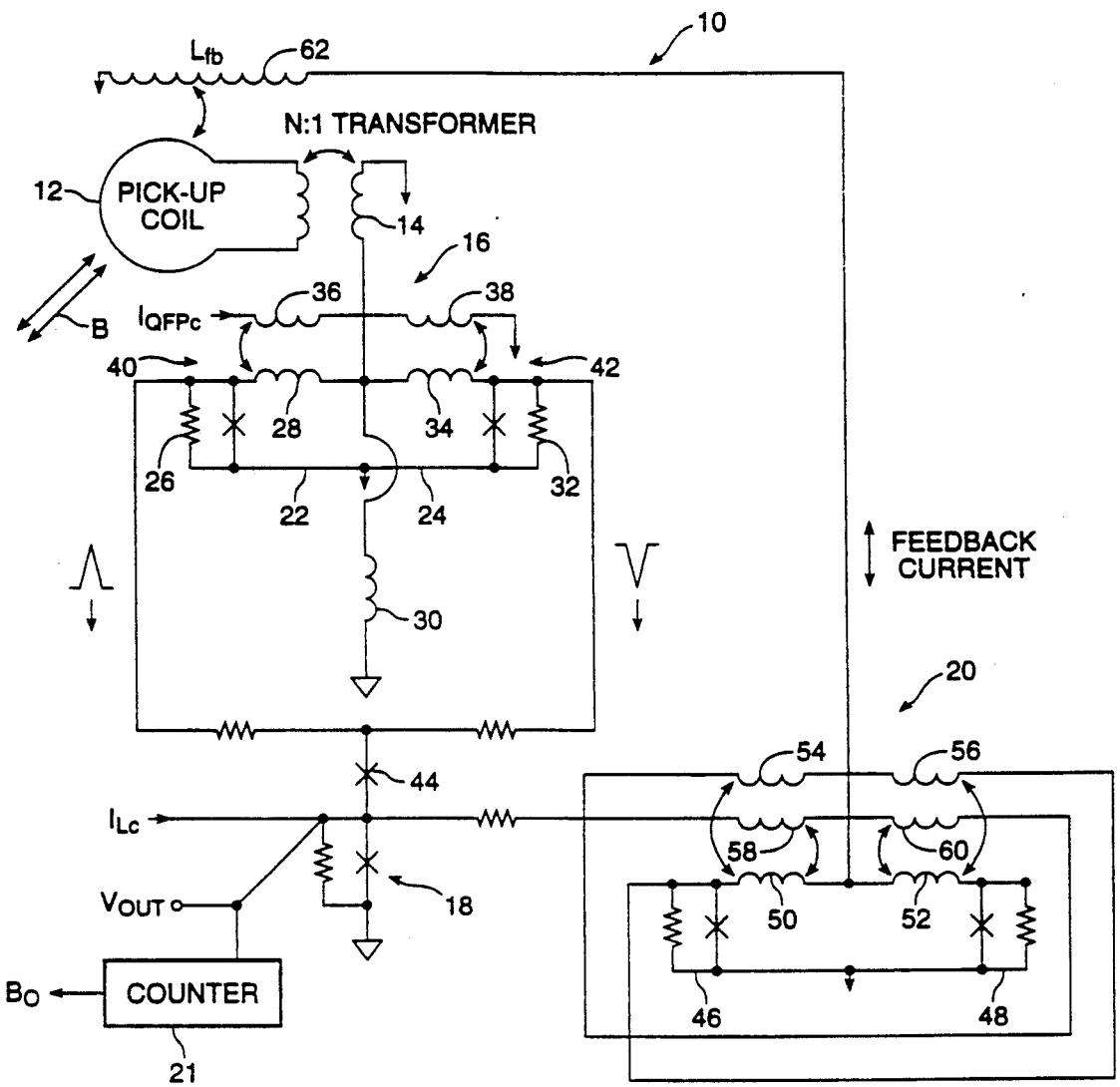
FIG. 1 is an circuit diagram of a superconducting digital magnetometer according to an embodiment of this invention.

FIG. 1 is a schematic diagram of a superconducting digital magnetometer 10 according to an embodiment of this invention. The function of the magnetometer 10 is to measure the amplitude and direction of a magnetic field B or a gradient of magnetic field B. The magnetometer 10 includes a magnetic pick-up coil 12, a transformer 14, a quantum flux parametron comparator 16, a pulse-triggering latch 18, a feedback gate 20 and a counter 21. Each element 12, 14, 16, 18, 20 is preferably fabricated as a superconducting component with appropriate cooling cryogenics (not shown), while the counter 21 is a conventional bidirectional counter. The pick-up coil 12 and transformer 14 are constructed of superconducting wire, while the circuit elements 16, 18 and 20 use Josephson junction devices.

The pick-up coil 12 senses the intensity and direction of the magnetic field B. The coil 12, however, may be wound as an $n^{th}$-order gradiometer for sensing, instead, the $n^{th}$-spatial derivative of the magnetic field B. In response to the magnetic field B, the pick-up coil 12 generates either a positive or negative current which is fed to transformer 14. Transformer 14 is an N:1 step-up transformer which amplifies the current received from coil 12 by the turns ratio, N. The input current and the amplified current are either positive or negative in relative polarity, depending on the direction of the magnetic field B.

The quantum flux parametron (QFP) comparator 16 includes two superconducting loops 22, 24. The first superconducting loop 22 is formed by a first Josephson junction device 26, a first inductor 28 and a load inductor 30. Similarly, the second superconducting loop 24 is formed by a second Josephson junction device 32, a second inductor 34 and the load inductor 30. The inductors 28, 34 are magnetically coupled to additional exciter inductors 36, 38 to form respective transformers 40, 42.

The QFP comparator 16 is coupled to receive two input signals. One input is the amplified current signal which is received from the N:1 transformer 14 into the inductors 28 and 34. The other input is a control current $I_{QFPc}$ which is fed into exciter coil 36 of QFP transformer 40. The control current signal $I_{QFPc}$ clocks the amplified current signal to pass either a positive voltage pulse or a negative voltage pulse (e.g., indicator signal) to the latch 18. For a positive amplified current signal, the control current $I_{QFPc}$ causes a positive voltage pulse to pass out of the first loop 22. For a negative amplified current signal, the control current $I_{QFPc}$ causes a negative voltage pulse to pass out of the second loop 24.

The generated pulse (e.g., indicator signal passes through an isolation junction 44 and to the latch 18. The isolation junction 44 is formed by a Josephson junction having two input channels. One input channel is coupled to the first superconducting loop 22. The other input channel is coupled to the second superconducting loop 24.

Latch 18 is clocked by a bipolar current signal $I_{Lc}$ having a frequency of one-half the frequency of $I_{QFPc}$ and a phase leading the phase of $I_{QFPc}$. The latch 18 stores either a positive or negative voltage signal depending on the state of the received pulse and the latch clock signal $I_{Lc}$. Four cases are considered. First, if a positive voltage pulse arrives during a positive $I_{Lc}$ clock cycle, then the latch 18 stores a positive voltage and outputs a positive current to feedback gate 20. Second, if a positive voltage pulse arrives during a negative $I_{Lc}$ clock cycle, then the latch 18 remains superconducting and causes no change at the feedback gate 20. Third, if a negative voltage pulse arrives during a positive $I_{Lc}$ clock cycle, then again the latch 18 remains superconducting and causes no change at the feedback gate 20. Fourth, if a negative voltage pulse arrives during a negative $I_{Lc}$ clock cycle, then the latch 18 stores a negative voltage and outputs a negative current to feedback gate 20.

The feedback gate 20 is formed by a superconducting loop including a pair of Josephson junction devices 46, 48 and a pair of inductors 50, 52. Additional input inductors 54, 56, and 58, 60 are coupled to the inductors 50, 52 to form a two-turn transformer. The gate 20 generates in response a packet of flux quantum which is output from the node between inductors 50, 52 to a feedback inductor 62.

The feedback gate 20 together with the feedback inductor 62 form a superconducting storage loop for storing current in positive or negative increments of a flux quantum per feedback inductance unit. For a positive current received from latch 18, the feedback gate 20 emits a positive flux quantum to the feedback inductor 62. For a negative current received from latch 18, the feedback gate 20 emits a negative flux quantum to the feedback inductor 62. When the latch remains superconducting so as not to pass a current to the feedback gate 20, the feedback gate 20 does not output a packet.

The feedback inductor 62 is magnetically coupled to the pick-up coil 12 for inducing a current in the pick-up coil 12 which opposes the induced current attributable to the sensed magnetic field B. During each clock cycle, the quantum flux packet fed back to the inductor 62 increases the flux countering the magnetic field B. As the magnetometer stabilizes, the counter flux offsets the magnetic field flux so that no current is generated by the pick-up coil 12. The feedback continues during successive clock cycles until the induced current resulting from the feedback flux cancels the induced current attributable to the sensed magnetic field B. Such negative feedback insures convergence of the magnetometer 10.

As the magnetometer 10 senses the magnetic field B, the voltage stored at the latch 18 during each $I_{Lc}$ clock cycle is output as a binary voltage signal $V_{out}$. This voltage signal $V_{out}$ triggers a counter circuit 21. When a positive voltage is stored, a positive $V_{out}$ is output causing the counter 21 to count up one bit. When a negative voltage is stored, a negative $V_{out}$ is output causing the counter 21 to count down one bit. When the magnetometer 10 stabilizes, the latch 18 is superconducting causing no change to the counter 21 over one clock cycle. Thus, the counter 21 stabilizes to the least significant bit. The stable counter reading $B'_o$ indicates the magnetic field intensity and direction (or the magnetic field gradient).

According to the cases described for the latch 18, the counter 21 receives a count signal during the positive portion of the latch clock signal for a magnetic field direction corresponding to a positive indicator signal. Similarly, the counter 21 receives a count signal during the negative portion of the latch clock signal for a magnetic field direction corresponding to a negative indicator signal.

The resolution and speed of the magnetometer 10 are related to the magnetometer slew rate. Such slew rate is proportional to the clock frequencies of the control current clock signal $I_{QFPc}$ and the bipolar latch clock signal $I_{Lc}$. By using superconducting elements, clock frequencies over 1 GHz are achievable.

Negligible Clock Injection Coupling

Figure 2:
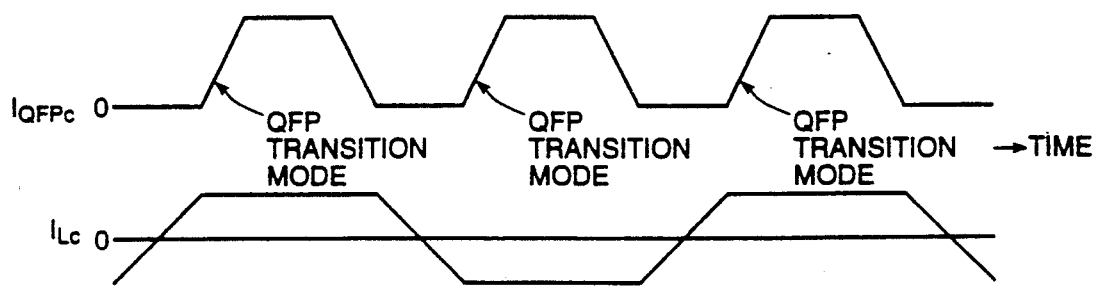
FIG. 2 is a chart of the QFP control clock current signal and the latch clock current signal for the embodiment of FIG. 1.

By using a pulse triggered latch 18, the injection coupling of the latch clock signal $I_{Lc}$ back into the QFP comparator 16 is negligible. At low clock frequencies, injection coupling does not occur. To minimize injection coupling at very high frequencies, the latch clock signal $I_{Lc}$ phase is defined such that the QFP comparator 16 output current pulses at the maxima or minima of the latch clock signal $I_{Lc}$ as shown in FIG. 2. Because $dI_{Lc}/dt$ is zero at the maxima and minima, such a phase relationship substantially eliminates voltage, $L_j(dI_{Lc}/dt)$, across the latch junction, where $L_j$ is the junction's inductance. By eliminating such a voltage, injection coupling back through isolation junction resistors into the QFP comparator 16 is substantially eliminated.

Figure 3:
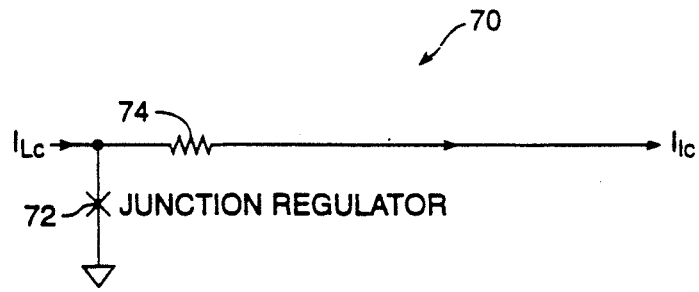
FIG. 3 is a circuit diagram of a regulator junction which may be coupled to the latch input of FIG. 1.
Figure 4:
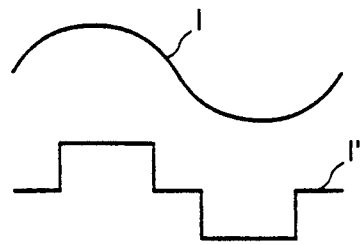
FIG. 4 is a chart of unregulated and regulated latch clock current signals.

Another approach for substantially eliminating $dI_{Lc}/dt$, and thus substantially eliminating injection coupling back to the QFP comparator 16, is to route the latch clock signal $I_{Lc}$ through a junction regulator. FIG. 3 shows a junction regulator circuit 70, including Josephson junction device 72 having a resistor 74. FIG. 4 shows the latch clock signal I as input to the regulator circuit 70, along with the regulated clock signal output I'. By clipping the latch clock signal to provide substantially flat amplitudes the $dI_{Lc}/dt$ becomes substantially zero.

Common Clock Source

Figure 5:
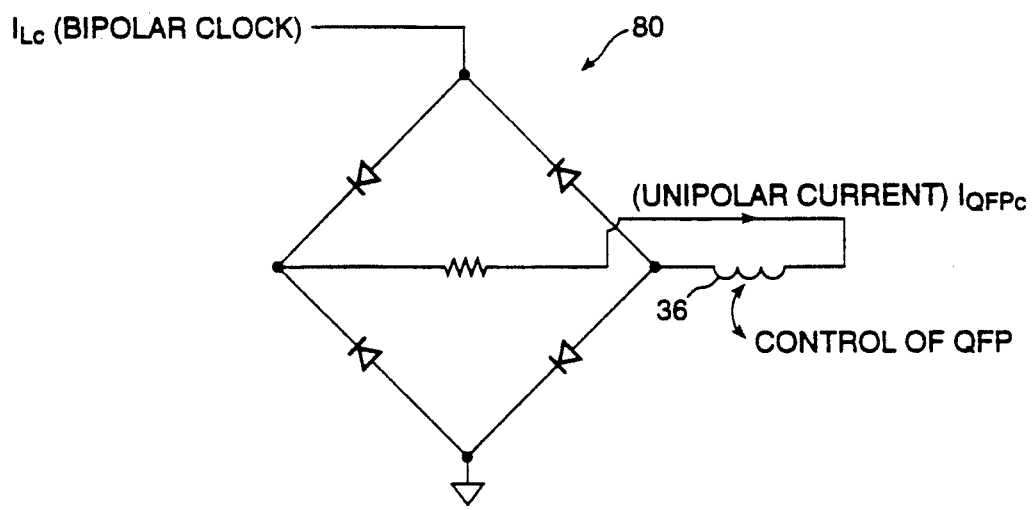
FIG. 5 is a circuit diagram of a full-wave rectifier for converting the latch clock current signal to the QFP control clock current signal.

According to one embodiment, the latch clock signal $I_{Lc}$ and the QFP control clock signal $I_{QFPc}$ may be generated from a common external clock signal. As previously described, the control clock signal $I_{QFPc}$ preferably is twice the frequency of the latch clock signal $I_{Lc}$. Referring to FIG. 5, the external clock signal defines the latch clock signal $I_{Lc}$. Such clock signal is fed to the latch 18 as previously described, while also being fed to a full-wave rectifier circuit 80. The rectifier 80 converts the bipolar clock signal $I_{Lc}$ to a unipolar clock current having twice the frequency. As shown, the unipolar current signal is coupled to the exciter inductor 36 to define the control clock current signal $I_{QFP}$. Such inductor 36 is magnetically coupled to the inductor 28 as shown in FIG. 1.

Alternative Embodiment

Figure 6:
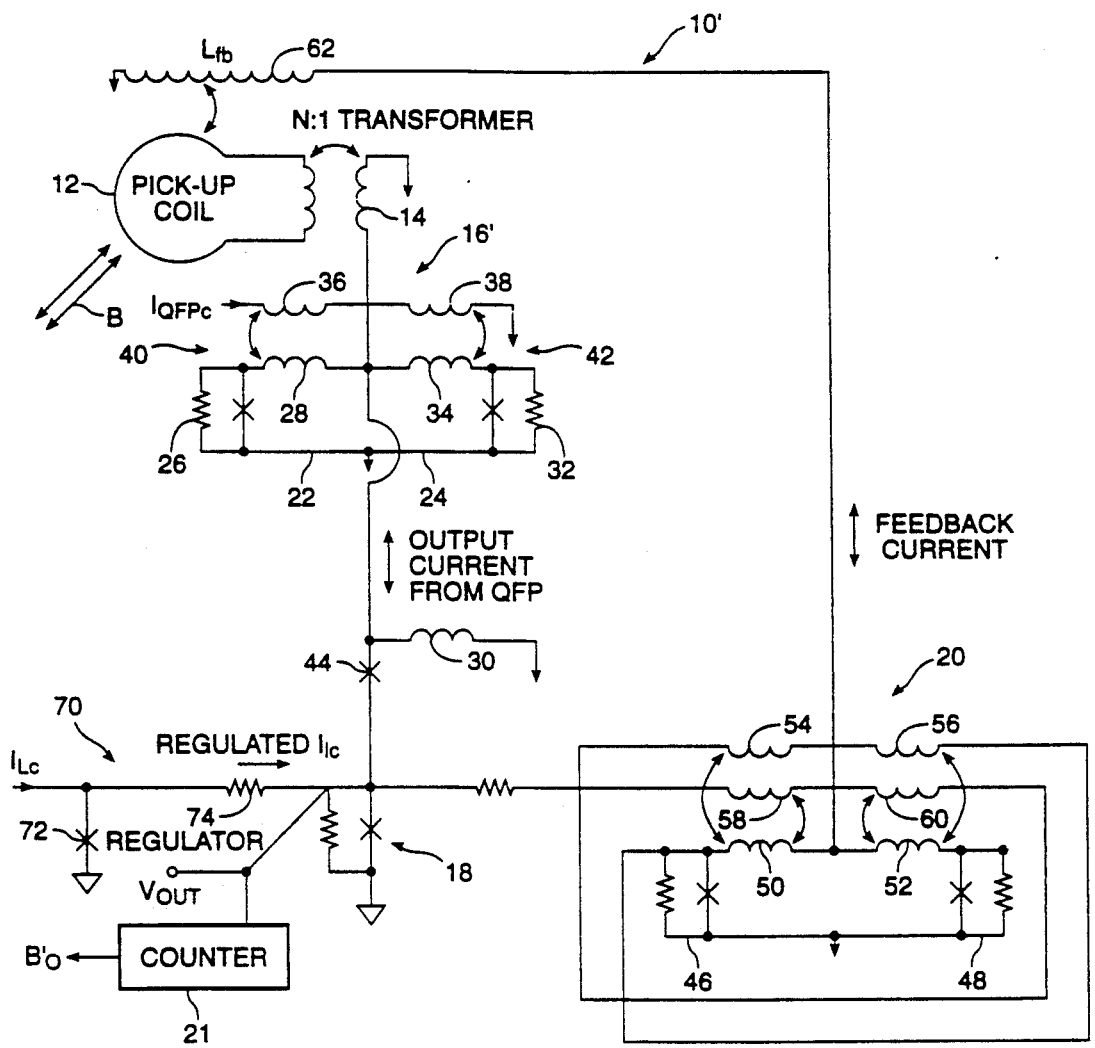
FIG. 6 is a circuit diagram of a superconducting digital magnetometer according to another embodiment of this invention.

FIG. 6 shows a magnetometer 10' according to another embodiment of this invention. The magnetometer 10' includes the pick-up coil 12, transformer 14, an alternatively-configured QFP comparator 16', isolation junction 44, latch 18, junction regulator circuit 70, feedback gate 20, feedback inductor 62 and counter 21. Again all the elements depicted, except the counter 21, are superconducting elements.

An alternative read-out scheme of QFP comparator 16' is used in this alternative embodiment for coupling the QFP output to latch 18. A dc current is output to the latch 18 in this embodiment, whereas a voltage pulse is output in the FIG. 1 embodiment. For a positive input signal to the QFP comparator 16', a positive dc current is output to the latch 18. For a negative input signal to the QFP comparator 16', a negative dc current is output to the latch 18.

Thus, the latch 18 stores either a positive or negative signal depending on the state of the received dc current (e.g., indicator signal) and the state of the latch clock signal $I_{Lc}$. Again, four cases are considered. First, if a positive dc current arrives during a positive $I_{Lc}$ clock cycle, then the latch 18 stores a positive voltage and outputs a positive current to feedback gate 20. Second, if a positive dc current arrives during a negative $I_{Lc}$ clock cycle, then the latch 18 remains superconducting and causes no change at the feedback gate 20. Third, if a negative dc current arrives during a positive $I_{Lc}$ clock cycle, then again the latch 18 remains superconducting and causes no change at the feedback gate 20. Fourth, if a negative dc current arrives during a negative $I_{Lc}$ clock cycle, then the latch 18 stores a negative voltage and outputs a negative current to feedback gate 20.

The feedback gate 20 together with the feedback inductor 62 form a superconducting storage loop as previously described. For a positive current received from latch 18, the feedback gate 20 emits a positive flux quantum to the feedback inductor 62. For a negative current received from latch 18, the feedback gate 20 emits a negative flux quantum to the feedback inductor 62. When the latch 18 remains superconductive, a current is not output to the feedback gate 20 and the gate 20 does not output a packet to the feedback inductor 62.

The feedback inductor 62 is magnetically coupled to the pick-up coil 12, inducing a current in the coil 12 countering the induced current attributable to the sensed magnetic field B. The negative feedback insures convergence of the magnetometer 10'. During each clock cycle, the quantum flux packet fed back to the inductor 62 increases the flux in opposition to the sensed magnetic field B. As the magnetometer stabilizes, the counter flux offsets the magnetic field flux so that no current is generated by the pick-up coil 12.

As the magnetometer 10' senses a magnetic field B, the voltage stored at the latch 18 during each $I_{Lc}$ clock cycle is output as a binary voltage signal $V_{out}$. This voltage signal $V_{out}$ triggers the counter circuit 21 to either count up or count down. When the magnetometer 10' stabilizes, the latch 18 is superconducting causing no change to the counter 21. Thus, the counter 64 stabilizes to the least significant bit. The stable counter reading $B'_o$ indicates the magnetic field intensity and direction (or the magnetic field gradient).

Figure 7:
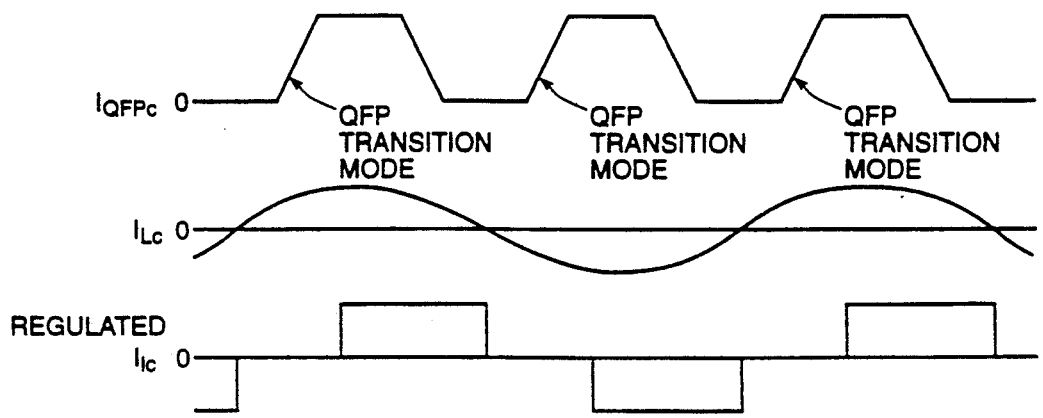
FIG. 7 is a chart of the QFP control clock signal and the regulated and unregulated latch clock signals for the embodiment of FIG. 6.

FIG. 7 shows the relation between the QFP control clock current $I_{QFPc}$ and the latch clock current $I_{Lc}$ for the embodiment of FIG. 6. The latch clock current $I_{Lc}$ lags the control clock current $I_{QFPc}$ to avoid adverse injection coupling of the latch clock back into the QFP comparator 16'. According to the depicted QFP comparator configuration, current feeding into the latch 18 couples directly into the QFP comparator 16' according to an inductive divider configuration. Such coupling occurs at any frequency.

If such coupling occurred while the comparator 16 decision is being made, then the true sensed signal level may be masked. To avoid such masking, the regulator circuit 70 is included. Thus, the latch clock $I_{Lc}$ is fed through the junction 72 and regulated to form the clipped $I_{lc}$ clock. As a result, the regulator output appears as a short circuit prior and during the QFP decision. Once the regulator circuit 70 switches, the regulated clock $I_{lc}$ clocks the latch 18 according to the cases described above. The positive or negative latching results in a positive or negative current fed into the feedback gate 20, a positive or negative flux quantum packet output to the feedback inductor 62 and a positive or negative change to the count.

Conclusion

Figure 1A:
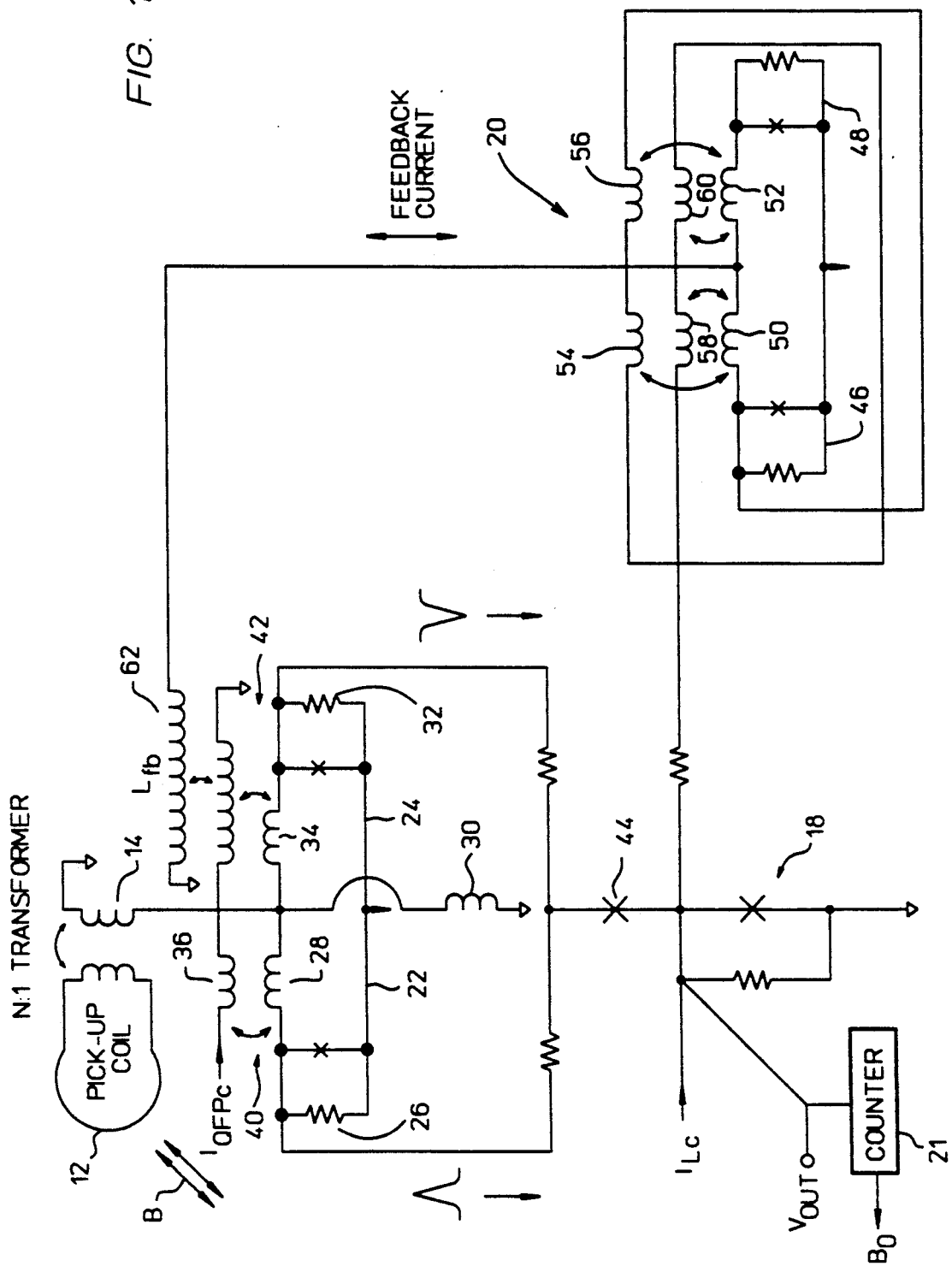
FIG. 1A is a circuit diagram of a superconducting digital magnetometer according to another embodiment of this invention.

Although specific embodiments of the invention have been illustrated and described, various alternatives, modifications and equivalents may be used. For example, although the feedback inductor 62 is magnetically coupled to the pick-up coil 12, such inductor 62 alternatively may be coupled to the transformer 14 or QFP 16 as depicted in FIG. 1A. According to such embodiments, the packet of quantum flux is fedback to the transformer 14 or QFP 16, respectively. Further, although the counter 21 is described as a conventional bidirectional counter, other counting devices such as a microprocessor or gate array may be used, including either superconducting or non-superconducting components. Therefore, the foregoing description should not be taken as limiting the scope of the inventions which are defined by the appended claims.

What is claimed is:

1. A magnetic field sensing apparatus comprising:
   a pick-up coil for generating an induced current signal in response to a sensed magnetic field;
   a quantum flux parametron, coupled to said pick-up coil, for generating an indicator signal during a control clock signal cycle based upon said induced current;
   means coupled to the parametron for storing the indicator signal during a storage means clock signal cycle, the storage means generating an output current in response to the stored indicator signal;
   means, coupled to said storing means, for generating a packet of quantum flux in response to the output current, said generating means being different from said storing means; and
   inductive means, coupled to said generating means, disposed to receive the quantum flux packet for generating a current in polar opposition to said induced current of the pick-up coil.

2. The apparatus of claim 1 in which the inductive means is magnetically coupled to the pick-up coil for generating the opposing induced current in the pick-up coil.

3. The apparatus of claim 1 in which the inductive means is magnetically coupled to the quantum flux parametron.

4. The apparatus of claim 1 further comprising means is coupled to the pick-up coil for amplifying the induced current, and wherein the quantum flux parametron generates the indicator signal in response to the amplified current during the control clock signal cycle.

5. The apparatus of claim 1 in which the inductive means is magnetically coupled to the amplifying means.

6. The apparatus of claim 4 further comprising means, coupled to said storing means, for digitally counting in response to the storage means contents of a storage means clock signal cycle to accumulate a count.

7. The apparatus of claim 6 wherein stabilization occurs upon cancellation of said opposing induced current by said induced current, and wherein said count at the time of stabilization corresponds to either
   1) a value indicative of a magnetic field intensity and direction of the sensed magnetic field, or
   2) a value indicative of a magnetic field gradient of the sensed magnetic field.

8. The apparatus of claim 1 wherein the pick-up coil, amplifying means, quantum flux parametron, storage means, packet generating means, and inductive means are operative as superconducting circuit elements.

9. The apparatus of claim 8 in which the storage means is superconductive when an indicator signal of a first polarity occurs during a storage means clock signal portion having a second polarity, and wherein the counter means and the packet generating means are quiescent.

10. A superconducting magnetic field sensing apparatus comprising:
   a pick-up coil for generating an induced current signal in response to a sensed magnetic field and a feedback flux;
   means coupled to the pick-up coil for amplifying the induced current;
   a quantum flux parametron, coupled to said amplifying means, for generating an indicator signal in response to the amplified current during a cycle of a control clock signal;
   means coupled to the parametron for storing the indicator signal during a storage means clock signal cycle, the storage means generating an output current in response to the stored indicator signal;
   means, coupled to said storing means, for generating a packet of quantum flux in response to the output current, said generating means being different from said storing means; and inductive means magnetically coupled to the pick-up col and disposed to receive the quantum flux packet for generating said feedback flux, wherein induced current attributable to the feedback flux opposed induced current attributable to the sensed magnetic field;

wherein the pick-up coil, amplifying means, quantum flux parametron, storage means, packet generating means and inductive means are operative as superconducting elements.

11. The apparatus of claim 10 further comprising means, coupled to said storing means, for digitally counting in response to content of the storage means during a storage means clock signal cycle to accumulate a count.

12. The apparatus of claim 11 in which said induced current is constrained to stabilize when the current attributable to the feedback flux cancels the current attributable to the sensed magnetic field, and wherein said count at the time of stabilization corresponds to either
1) a magnetic field intensity and direction of the sensed magnetic field, or
2) a magnetic field gradient of the sensed magnetic field.

13. The apparatus of claim 10 further comprising a superconducting isolation junction for electrically coupling the parametron with the storage means.

14. The apparatus of claim 11 in which a non-zero induced current is identified as a directional signal, and wherein the indicator signal comprises a voltage pulse having a first polarity for an amplified current of a first direction and a voltage pulse having a second polarity for an amplified current of a second direction, said counting means being bidirectional for counting in one direction in response to storage means contents corresponding to an indicator signal of a first polarity and for counting in another direction in response to storage means contents corresponding to an indicator signal of a second polarity.

15. The apparatus of claim 14 in which the storage means clock signal is selected to be one-half the frequency of the control clock signal and of a phase which leads the control clock signal phase.

16. The apparatus of claim 14 in which the storage means clock signal is selected to be one-half the frequency of the control clock signal and of a phase defined such that the parametron voltage pulse occurs at either one of a maxima or minima of the storage means clock signal.

17. The apparatus of claim 11 wherein a non-zero induced current is identified as a directional signal, and wherein the indicator signal comprises a dc current having a first polarity in response to an amplified current of a first direction and a dc current having a second polarity in response to an amplified current of a second direction, said counting means being bidirectional for counting in one direction in response to storage means contents corresponding to an indicator signal of a first polarity and for counting in another direction in response to storage means contents corresponding to an indicator signal of a second polarity.

18. The apparatus of claim 17 wherein the storage means clock signal is selected to be one-half the frequency of the control clock signal and of a phase which lags the control clock signal phase.

19. The apparatus of claim 18 further comprising a superconducting isolation junction for electrically coupling the parametron and with the storage means.

20. The apparatus of claim 10 further comprising:
means for regulating the storage means clock signal, the storage means receiving a clock signal which is regulated.

21. The apparatus of claim 10 wherein the control clock signal is derived from the storage means clock signal, the storage means clock signal being a bipolar signal, the apparatus further comprising:
full-wave rectifying means disposed to receive the bipolar storage means clock signal for generating in response a unipolar waveform of double the frequency, the unipolar waveform constituting the control clock signal.

22. The apparatus of claim 10 wherein the storage means clock signal is bipolar and the indicator signal is directional, and wherein a positive output current is constrained to be sent to the packet generating means in response to a positive indicator signal that occurs during a positive portion of the storage means clock signal.

23. The apparatus of claim 10 wherein the storage means clock signal is bipolar and the indicator signal is directional, and wherein a negative output current is constrained to be sent to the packet generating means in response to a negative indicator signal that occurs during a negative portion of the storage means clock signal.

24. The apparatus of claim 10 wherein the storage means clock signal is bipolar and the indicator signal is directional, and wherein the storage means is constrained to remain superconducting when a negative indicator signal occurs during a positive portion of the storage means clock signal.

25. The apparatus of claim 10 wherein the storage means clock signal is bipolar and the indicator signal is directional, and wherein the storage means remains superconducting when a positive indicator signal occurs during a negative portion of the storage means clock signal.

26. The apparatus of claim 10 wherein the quantum flux parametron, storage means, packet generating means, and inductive means are integrally formed on a common substrate.

* * * * *